United States Patent [19]

Kawamoto

[11] Patent Number: 5,255,162
[45] Date of Patent: Oct. 19, 1993

[54] LIGHTING DEVICE FOR A GRILLE OF A CAR STEREO

[75] Inventor: Masashi Kawamoto, Saitama, Japan
[73] Assignee: Pioneer Electric Corporation, Tokyo, Japan
[21] Appl. No.: 879,235
[22] Filed: May 6, 1992
[30] Foreign Application Priority Data
  May 7, 1991 [JP] Japan .............. 3-041246[U]
  Dec. 9, 1991 [JP] Japan .............. 3-109240[U]
[51] Int. Cl.⁵ ............................ G01D 11/28
[52] U.S. Cl. ...................... 362/26; 362/31; 362/330; 362/339; 359/49
[58] Field of Search ........... 362/26, 27, 29, 31, 362/330, 339; 359/49, 48, 40
[56] References Cited

U.S. PATENT DOCUMENTS

| | | | |
|---|---|---|---|
| 2,770,712 | 11/1956 | Dros | 362/26 |
| 3,242,328 | 3/1966 | Kapany et al. | 362/31 |
| 3,514,940 | 6/1970 | Keane, Jr. et al. | 362/26 |
| 4,322,780 | 3/1982 | Murakami et al. | 362/31 |
| 4,747,672 | 5/1988 | Yasuhara et al. | 359/49 |
| 4,755,035 | 7/1988 | Kopish et al. | 359/48 |
| 4,771,368 | 9/1988 | Tsukamoto et al. | 362/29 |

Primary Examiner—Albert J. Makay
Assistant Examiner—Alan B. Cariaso
Attorney, Agent, or Firm—Nikaido, Marmelstein, Murray & Oram

[57] ABSTRACT

A grille of a car stereo has a recess, an operation flap pivotally mounted in the recess, an opening for inserting a sound recording medium formed at a position behind the flap, and a liquid crystal display panel provided in the flap. The lighting device has a light source provided behind the grille and a light introducing plate, so that the liquid crystal display panel and the opening are lighted by light transmitted from the light source through the light introducing plate.

10 Claims, 14 Drawing Sheets

LIGHTING DEVICE FOR A GRILLE OF A CAR STEREO

BACKGROUND OF THE INVENTION

The present invention relates to a lighting device of a grille which is mounted at a front of a car stereo.

Development in electronic technology has caused it possible to manufacture a multi-functional, sophisticated, compact, and precisely controlled car stereo. As a result, a combination car stereo has become to be widely used instead of a component car stereo. For example, a mechanical preset tuner is changed by a phase-locked loop (PLL) tuner, and a cassette tape player is logically controlled. In addition, the power of the amplifier is increased for operating four speakers. Such a sophisticated car stereo is provided with a liquid crystal display (LCD) panel for indicating operational states of the car stereo. The LCD panel is back-lighted.

FIGS. 14 to 16 show a grille 1 of a conventional car stereo. Referring to FIG. 14, formed on the front panel of the grille 1 are a CD opening 2 at an upper portion thereof, and recess 1a under the opening 2. On the back side of the grille 1 is formed a recess 10 having a cassette opening 10a which communicates with an opening formed in a body of the car stereo as shown in FIG. 15.

An operation flap 4 is rotatably mounted on a lateral shaft 3 (FIG. 15) mounted in a lower portion of the recess 1a so as to be fitted therein. The flap 4 is downwardly opened for an access to the cassette opening 10a.

As shown in FIG. 16, the operation flap 4 has a base plate 8 disposed in a rear portion of the flap 4, a liquid crystal display (LCD) 5 disposed at a front portion, a lens 6 disposed in a housing 7 interposed between the base plate 8 and the LCD 5. Each of the elements 5 to 8 has a planar shape. A plurality of lamps 9 are mounted each side of the flap 4 so as to back-light the LCD 5 through the lens 6.

Underneath the recess 10, a lens 11 and a lamp 12 are provided to illuminate the opening of the recess 10. On the right and the left sides of the flap 4, a plurality of push buttons 18 and 17 are provided (FIG. 14). The buttons 18 and 17 are illuminated by lamps 16 and 15, through lenses 14 and 13, respectively which are disposed in the grille 1. Thus, the lamps 12, 15 and 16 are lit to illuminate various portions of the grille 1, which is convenient when driving a motor vehicle at night.

As shown in FIG. 16, since lamps 9 are provided at the side portions of the operation flap 4, the thickness of the flap is increased. Thus, if the front plane of the grille is to be flat, the thickness of the entire grille 1 must be increased. In addition, the lamps 12, 15 and 16 for illuminating the recess 10 and push buttons 17 and 18 cause the temperature of members in the grille 1 to rise. Furthermore, since the recess 10, and push buttons 17 and 18 are independently illuminated by the lamps 12, 15 and 16, respectively, the entire grille is not evenly illuminated, lacking unity in the lighting effect.

FIGS. 17 to 19 show a grille 1b which can be detached from a body 1A of a car stereo. The grille 1b has a cassette opening 2a at an upper portion thereof, through which a cassette tape 2A is inserted, and an LCD panel 4a at a center portion of the grille 1b. The LCD panel 4a comprises the housing 7 wherein LCD 5 and a lens 6a behind the LCD 5 are held, and the base plate 8. At the both sides of the lens 6a, a plurality of lamps 9a are provided in the housing 7 so as to back-light the LCD 5. The lamp 15 is provided at a side of the LCD panel 4a so as to illuminate the push buttons 17 and 18 without any lens.

In the detachable grille 1b, in addition to the problems inherent in the grille 1 shown in FIGS. 14 to 16, the lamps 9a and 15 are disposed far apart from one another. Moreover, since the lamp 15 directly illuminates the push buttons 17 and 18, the luminance is low.

SUMMARY OF THE INVENTION

An object of the present invention is to provide a lighting device of a grille wherein various parts of the grille is evenly illuminated and a LCD is appropriately back-lighted without increasing the thickness of the grille and the temperature thereof.

According to the present invention, there is provided a lighting device for a grille of a car stereo, the grille having a recess, an operation flap pivotally mounted in the recess, an opening for inserting a sound recording medium formed at a position behind the flap, a liquid crystal display panel provided in the flap, and a plurality of buttons for operating the car stereo. The lighting device comprises a light source provided in a rear portion of the grille and at least one light introducing plate confronting the light source, thereby back-lighting the liquid crystal display panel and illuminating the buttons and the opening.

The light introducing plate comprises a horizontal portion and a vertical portion.

In an aspect of the invention, the light source is disposed under the recess and adjacent a rear end surface of the light introducing plate.

In another aspect of the invention, the width of the rear end surface of the light introducing plate is smaller than the width of a front end surface of the plate at the back of the liquid crystal display panel, and the height of the rear end surface is smaller than the height of the front end surface.

In another aspect of the invention, the grille is detachably mounted on the body of the car stereo.

In a further aspect of the invention, the operation flap having the liquid crystal display (LCD) panel is detachably mounted on a holder pivotally mounted on the front panel of the car stereo body.

Thus, in accordance with the present invention, the LCD panel, the buttons and the openings of the recording medium are illuminated by the light source through the light introducing plate. As a result, the space taken up by the light source and the heat caused by the light sources are reduced.

The other objects and features of this invention will become understood from the following description with reference to the accompanying drawings.

DETAILED DESCRIPTION OF THE PREFERRED EMBODIMENT

Figure 1:
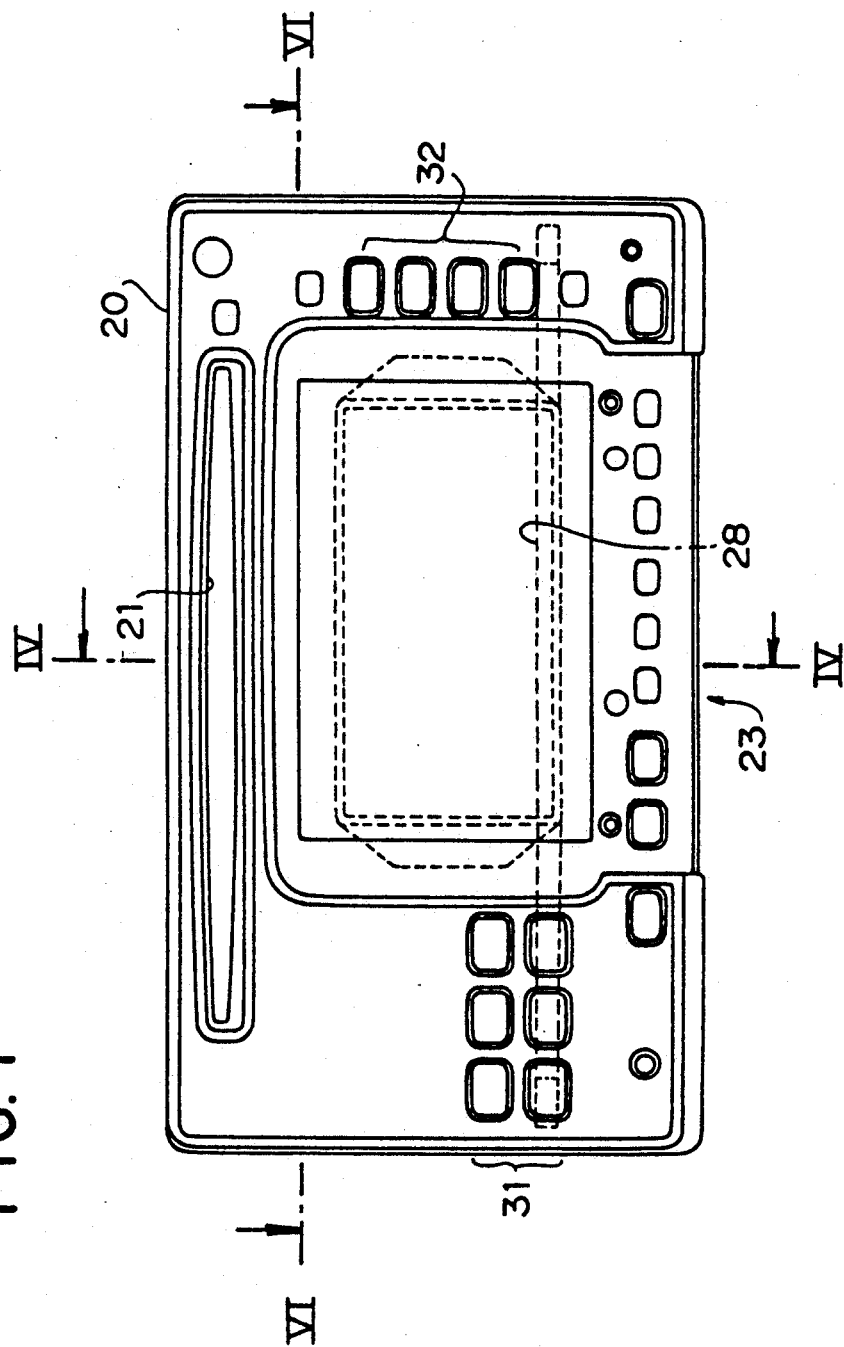
FIG. 1 is a front view of a grille of a car stereo to which a lighting device of the present invention is applied.
Figure 4:
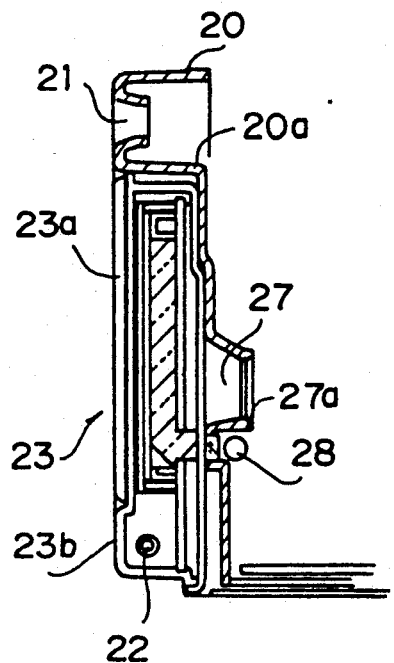
FIG. 4 is a sectional view of a grille taken along a line IV—IV of FIG. 1.
Figure 5:
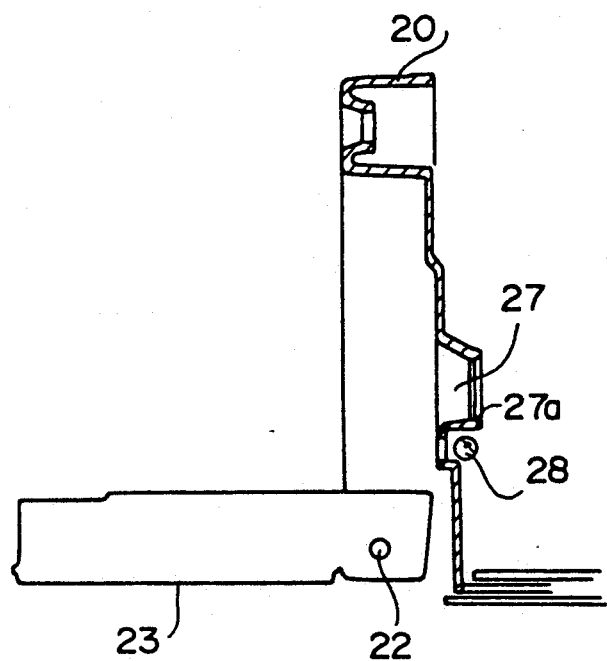
FIG. 5 is a sectional view of the grille when the flap is opened.

Referring to FIGS. 1 and 4, a grille 20 for a car stereo has a CD opening 21 at an upper portion thereof, and a recess 20a at a center portion under the opening 21. An operation flap 23 is pivotally mounted on a lateral shaft 22 which is mounted on a lower portion of the recess 20a so that the flap 23 can be downwardly opened as shown in FIG. 5. A plurality of push buttons 31 and 32 are provided on the grille 20 at the left and the right side portion of the flap 23, respectively.

Figure 2:
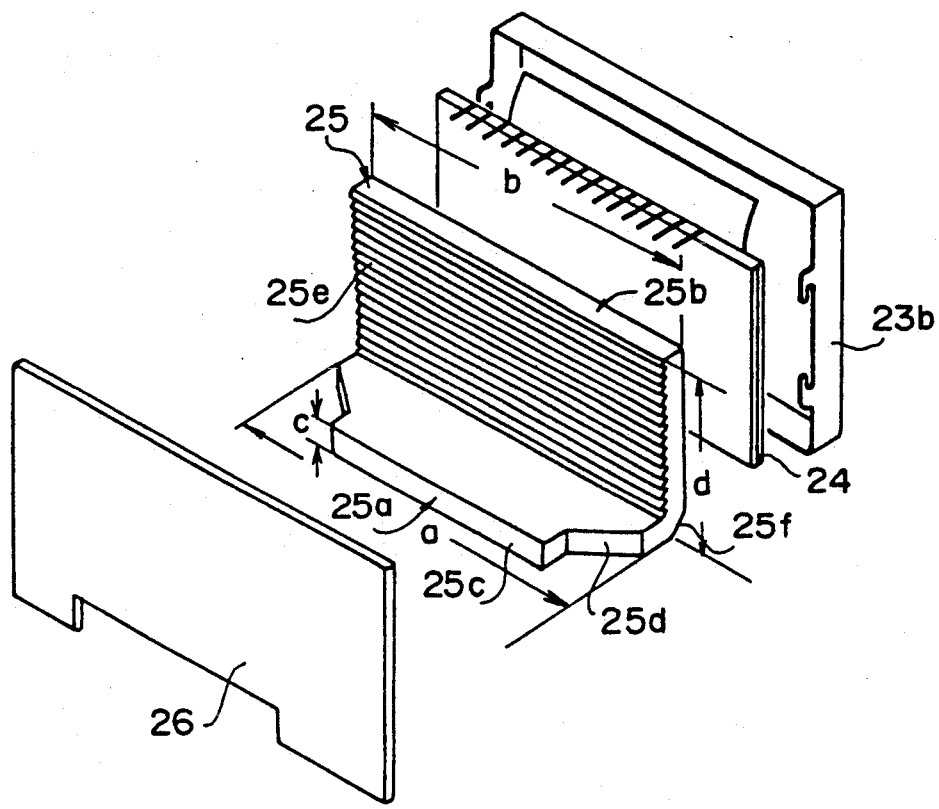
FIG. 2 is an exploded perspective view of a flap provided in the grille of FIG. 1.
Figure 6:
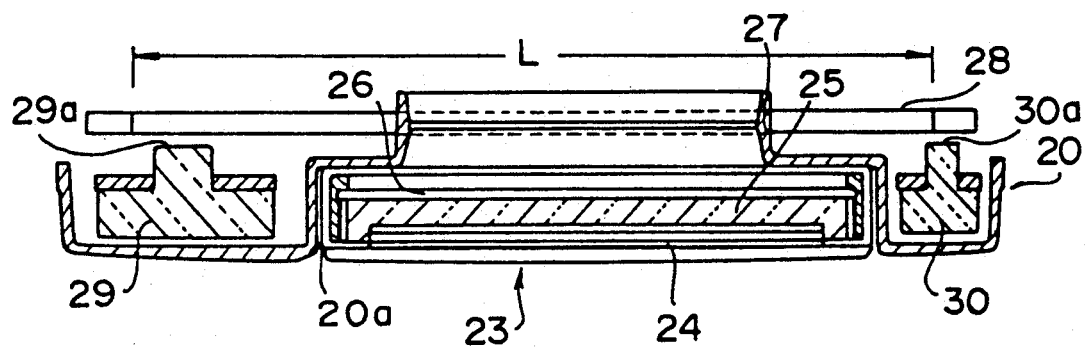
FIG. 6 is a sectional view of the grille taken along a line VI—VI of FIG. 1.
Figure 7:
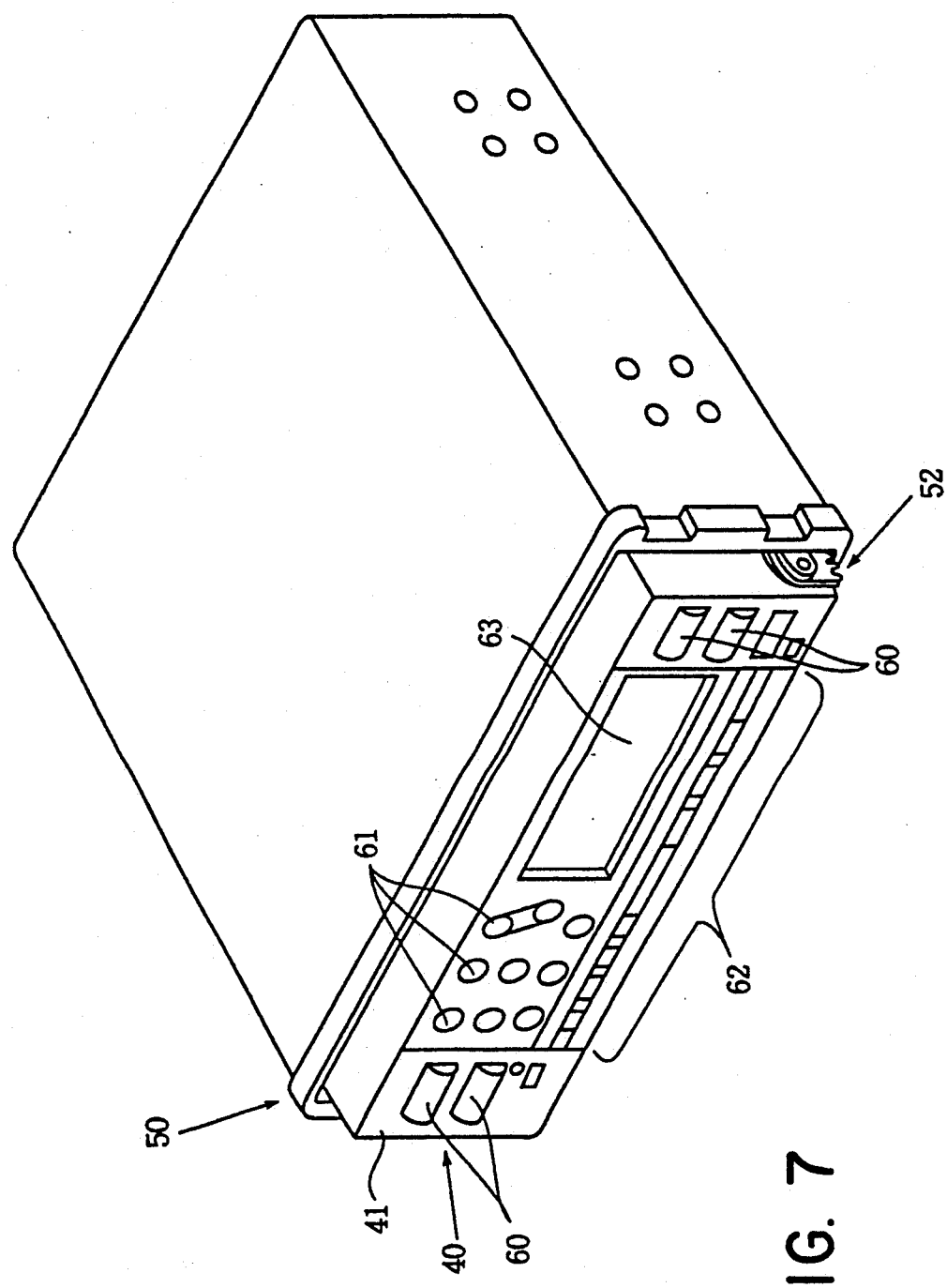
FIG. 7 is a perspective view of a car stereo having a detachable grille held in a frame.

Referring to FIGS. 4 and 6, the operation flap 23 comprises a holder 23b and a transparent plate 23a mounted on the front of the holder 23b. As is known from FIG. 2, the holder 23b houses a planar liquid crystal display (LCD) 24, a planar base plate 26 and a light introducing and diffusing plate 25 made of acrylic resin. The light introducing plate is interposed between the base plate 26 and the LCD 24.

The plate 25 has a horizontal portion 25a and a vertical portion 25b. The horizontal portion 25a has a rear end center surface 25c, inclined rear side surfaces 25d on both sides of the center surface 25c. Light beams emitted from a cold-cathode tube 28 (FIG. 4), which will be later described, enter the horizontal portion 25 at the surfaces 25c and 25d. On the back of the vertical portion 25b opposite the base plate 26, a plurality of horizontal ridges 25e are formed, each of which has a V-shaped cross section. The edge formed by the horizontal portion 25a and the vertical portion 25b is cut away to form an inclined reflective surface 25f. The width a of the rear end center surface 25a is smaller than the width b of the vertical portion 25b, and the height c of the rear end surface 25c and 25d is smaller than the height d of the vertical portion 25b.

As shown in FIG. 4, a laterally extending recess 27 having a cassette tape opening 27a on a rear wall thereof is formed on the back of the grille 20. The recess 27 and the opening 27a becomes apparent when the operation flap 23 is opened as shown in FIG. 5. The cold-cathode tube 28 having an effective length L is mounted on the back of the flap 23 under the recess 27 as shown in FIGS. 4 and 6. Light introducing plates 30 and 29 are disposed in the grille 20 at the right and left of the recess 20a adjacent the push buttons 32 and 31, respectively. A rear end surface 29a of the plate 29 and a rear end surface 30a of the plate 30 oppose the cold-cathode tube 28.

Figure 3:
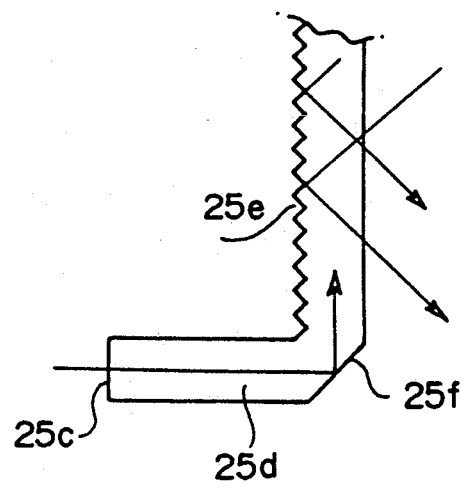
FIG. 3 is a schematic illustration explaining the operation of a lens in the flap of FIG. 2.

In operation, when the cold-cathode tube 28 is lit, the light beams enter the light introducing and diffusing plate 25 at the rear end surfaces 25c and 25d and reflected on the reflective surface 25f as shown in FIG. 3. The beam is diffused with the irregular reflection caused by the ridges 25e. The critical angle of the acrylic plate 25 is about 42.8 degrees. Thus beams within the critical angle is emitted from the plate 25, thereby illuminating the LCD 24 from the rear to show an image.

At the same time, the light beams enter the light introducing plates 29 and 30 at the rear end surfaces 29a and 30a, thereby illuminating the push buttons 31 and 32. The cassette tape opening 27a is also illuminated by the cold-cathode tube 28 through the light introducing plate 25.

Thus, in accordance with the present invention, the LCD 24 is back-lighted by the cold-cathode tube 28 through the thin plate 25 which introduces and diffuses the light beams. The thickness of the operation flap 23 is accordingly reduced, thereby reducing the overall thickness of the grille 20.

Since the only heat source is the cold-cathode tube 28, the temperature of members in the grille 20 is prevented from rising. Moreover, owing to the diffusion of light by the light introducing plates 25, 29 and 30, the cassette tape opening 27a and various push buttons 31 and 32 are evenly illuminated at the same light quantity by the cold-cathode tube 28.

The present invention may be applied to a car stereo having a detachable grille as showing in FIGS. 7 to 13.

Figure 8:
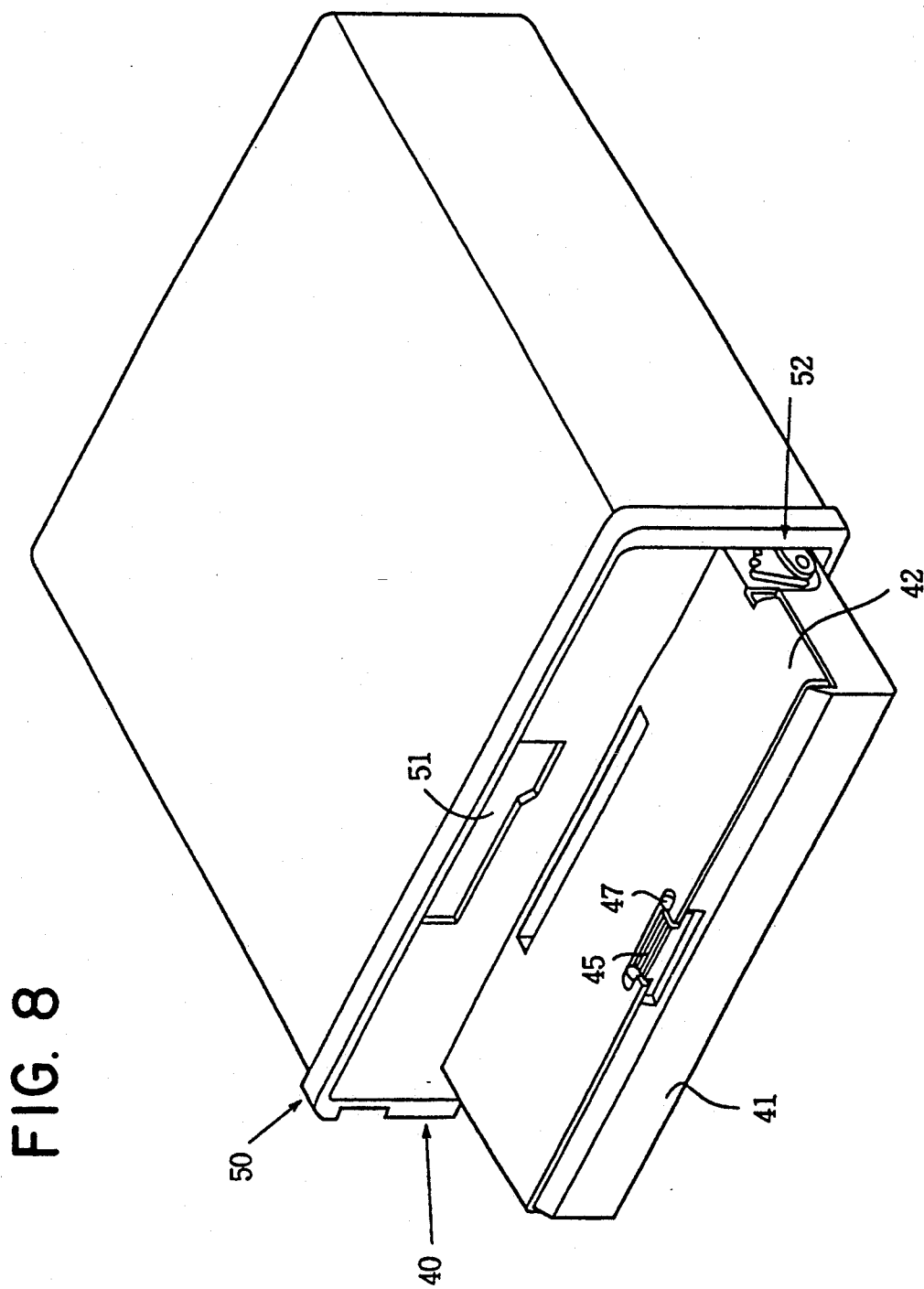
FIG. 8 is a perspective view of the car stereo when the detachable grille is opened.
Figure 9:
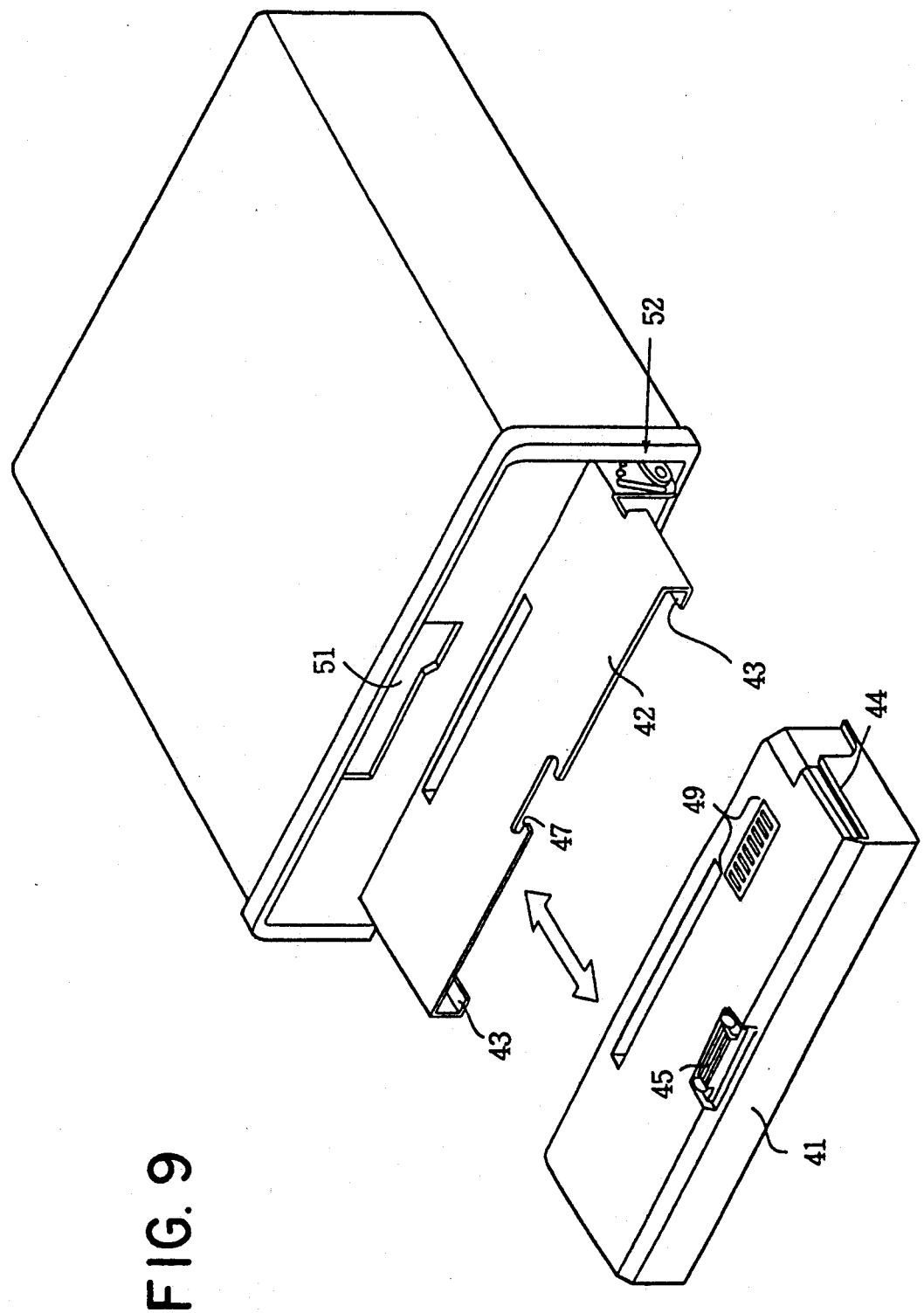
FIG. 9 is a perspective view of the car stereo showing the grille in a detached state.
Figure 10:
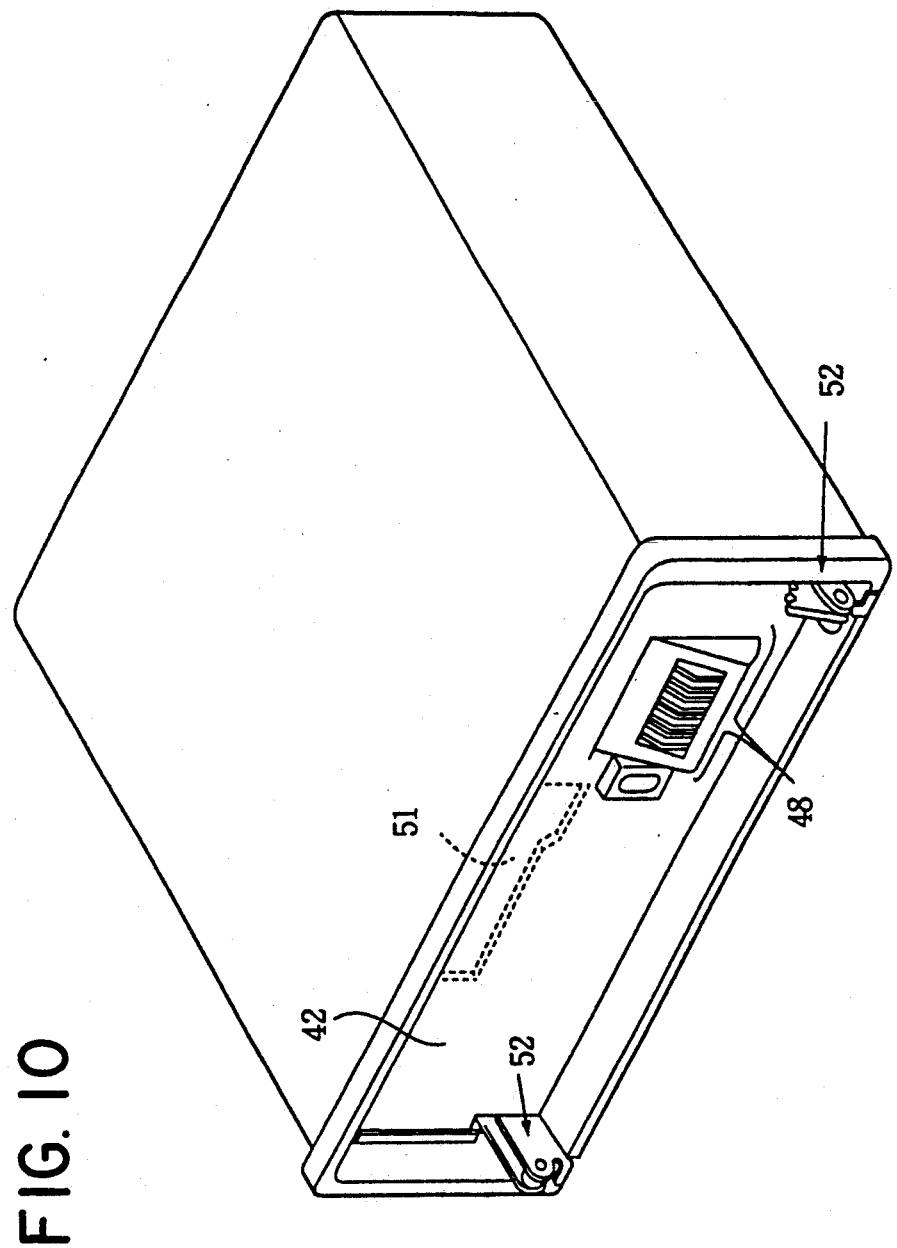
FIG. 10 is a perspective view of the car stereo showing the frame in the closed state.

Referring to FIGS. 7 to 10, a grille 40 is mounted on a body 50 of a car stereo. As shown in FIG. 9, the grille 40 comprises a flap holder 42 pivotally mounted on a front portion of the car stereo body 50 by a pivot mechanism 52, and an operation flap 41 detachably inserted in the holder 42. As shown in FIG. 8, the car stereo body 50 has a cassette tape opening 51 which becomes apparent when the grille 40 is opened.

Provided on the front panel of the flap 41 are an LCD panel 63, at the center portion thereof, a plurality of push buttons 61 disposed beside the panel 63, preset switches 62 under the buttons 61 and the panel 63, and a plurality of push button 60 on side portions of the flap 41.

Referring to FIG. 9, on the back of the flap 41, grooves 44 are formed on the rear side edges thereof. Both side edges of the holder 42 are bent to form rails 43 which are adapted to be slidably inserted in the grooves 44 of the flap 41. The flap 41 is locked in the holder 42 by the engagement of a projection 45 formed on an upper portion of the back thereof, with a recess 47 formed in the holder 42 at a corresponding location. The flap 41 has a plurality of connector 49 on the back. The connectors 49 are connected to a plurality of connectors (not shown) projecting from the holder 42 and connected to an electric device disposed in the body, thereby providing an electrical connection between the flap 41 and the body 50.

Figure 11:
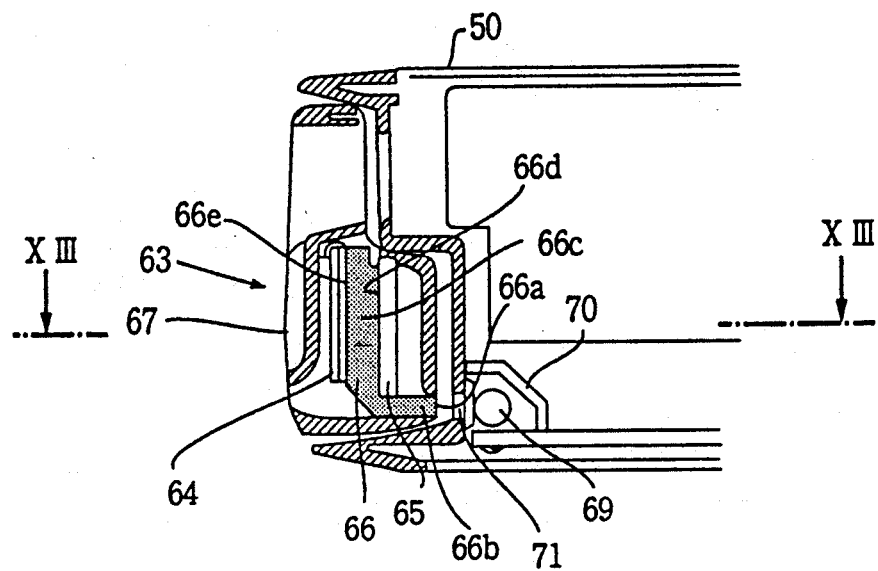
FIG. 11 is a sectional view of the grille and the car stereo of FIG. 7.
Figure 12:
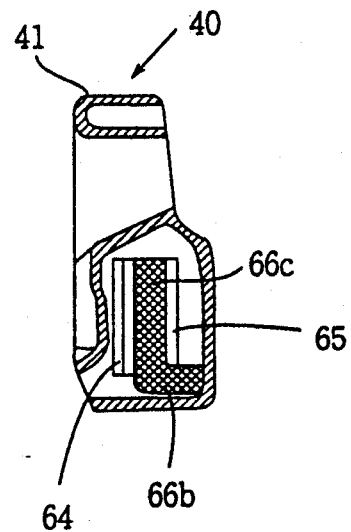
FIG. 12 is an enlarged sectional view of the grille of FIG. 11.
Figure 13:
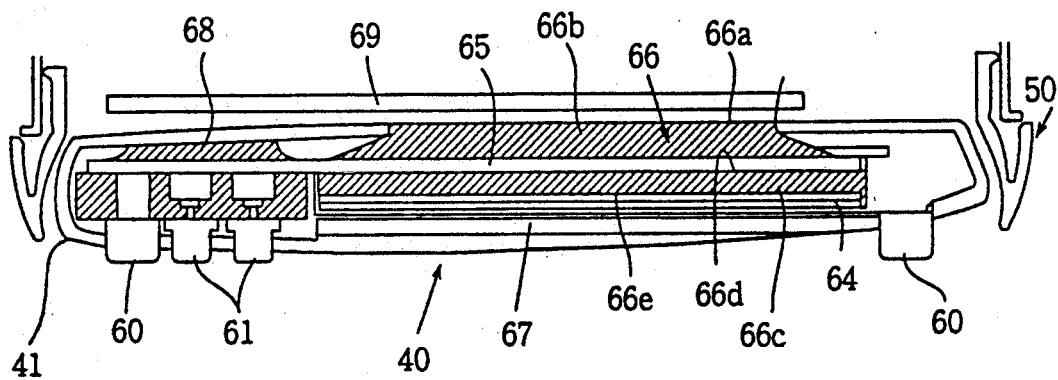
FIG. 13 is a sectional view of the grille taken along a line XIII—XIII of FIG. 11.
Figure 14:
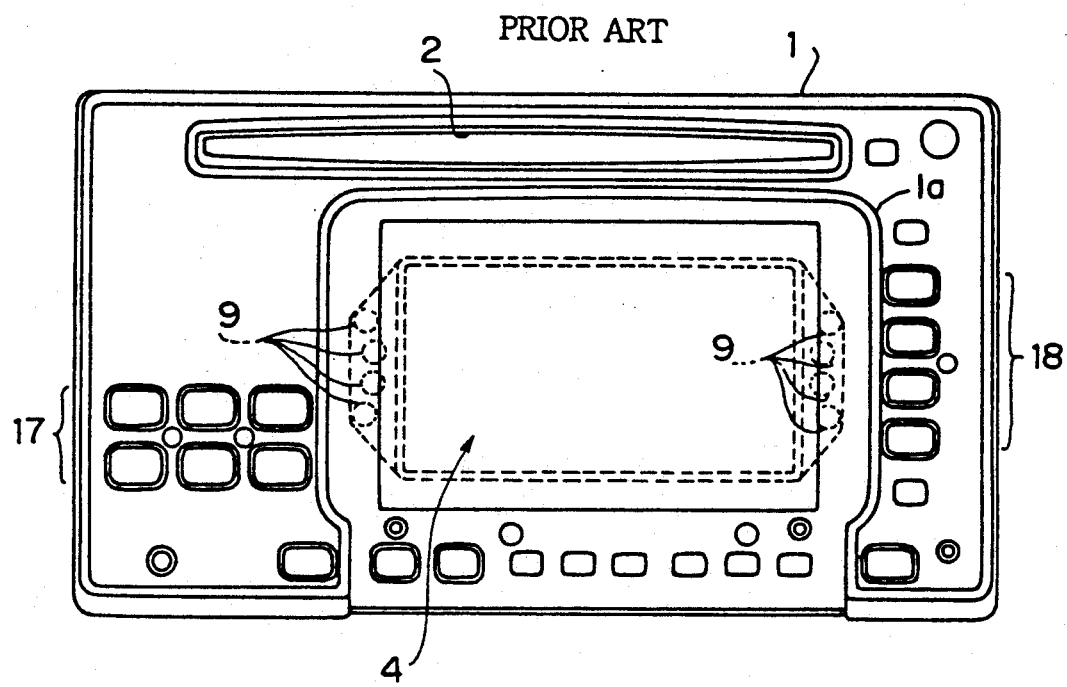
FIG. 14 is a front view of a grille of a car stereo having a conventional light device.
Figure 15:
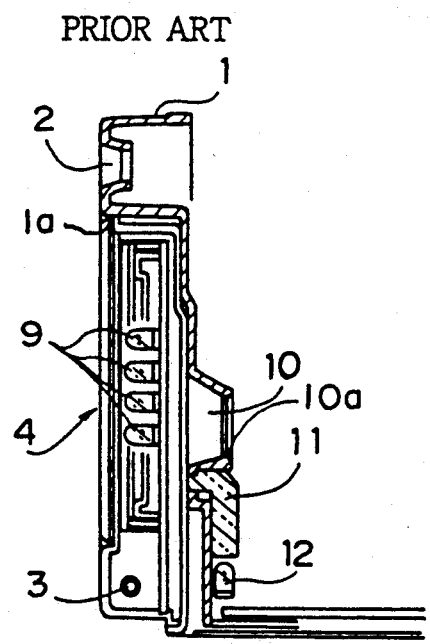
FIG. 15 is a sectional side view of the grille.
Figure 16:
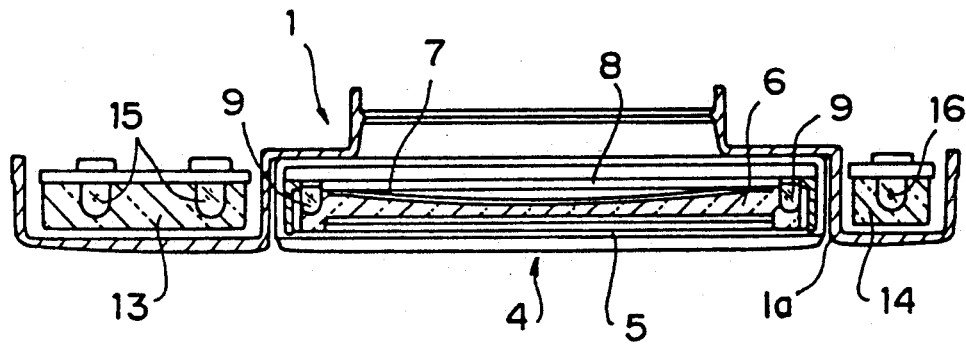
FIG. 16 is a sectional plan view of the grille.
Figure 17:
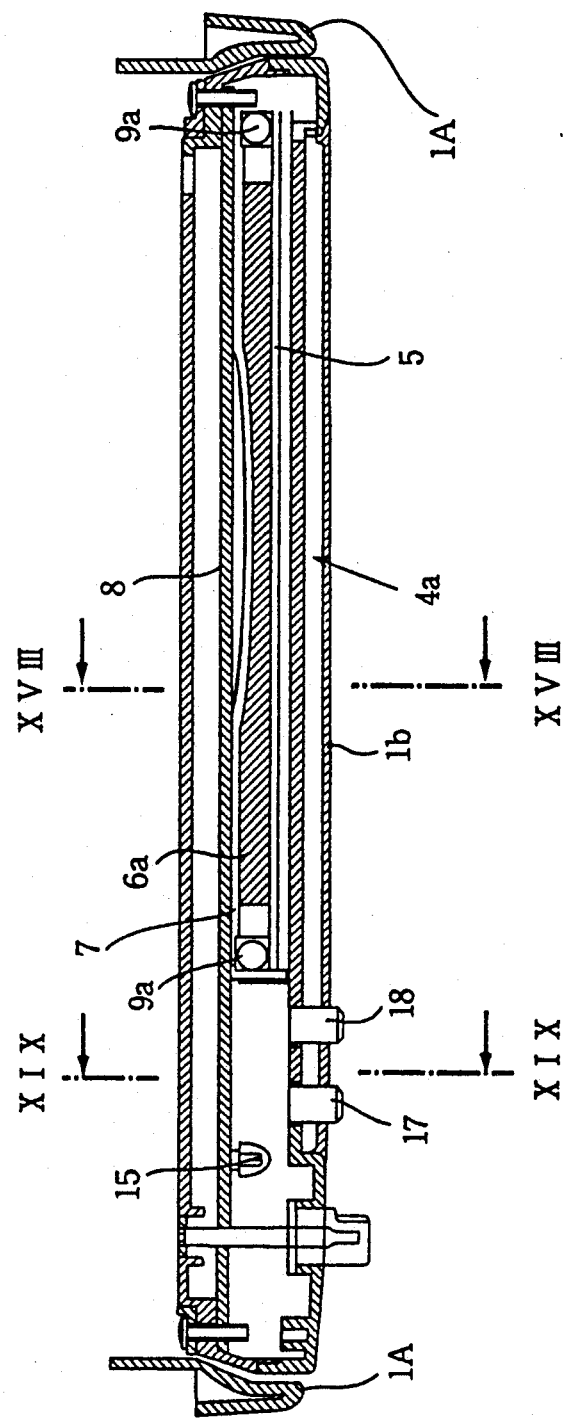
FIG. 17 is a sectional view of a detachable grille of a car stereo having a conventional lighting device.
Figure 18:
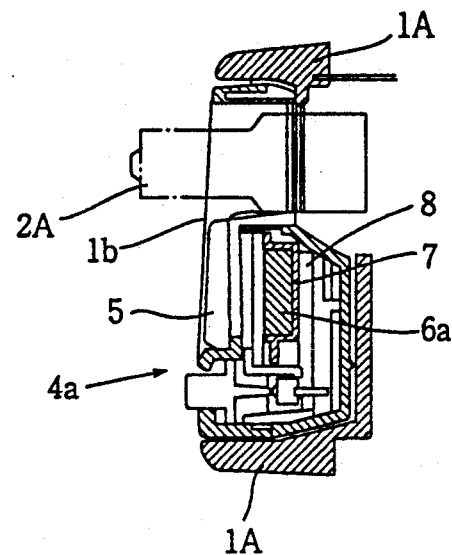
FIG. 18 is a sectional view of the detachable grille taken along a line XVIII—XVIII of FIG. 17.
Figure 19:
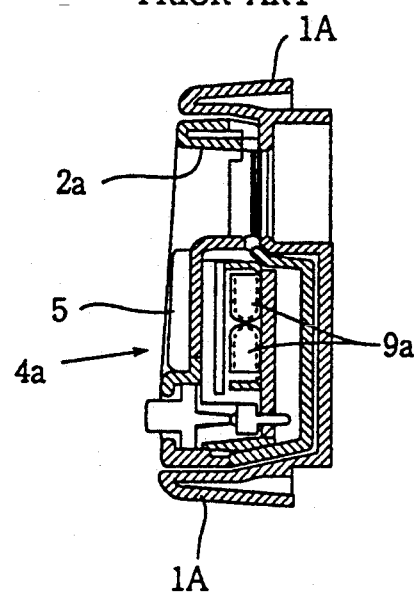
FIG. 19 is a sectional view of the grille taken along a line XIX—XIX of FIG. 17.

FIGS. 11 to 13 schematically show a lighting device for the detachable grille 40. The flap holder 41 is omitted in the figures for the ease of explanation.

The liquid crystal display panel 63 comprises a base plate 65 laterally extending through approximately the entire width of the operation flap 41, an L-shaped light introducing plate 66 attached on the plate 65, and LCD 64 mounted on the front surface of the plate 63, and a transparent plate 67 in front of the LCD 64 arranged to be in flush with the front panel of the flap 41. The light introducing plate 66 comprises a horizontal portion 66b having a rear end surface 66a, and a vertical portion 66c having a front end surface 66e and irregular reflective surface 66d which oppose the base plate 65.

A light introducing plate 68 is provided in the base plate 65 at the rear portion of each group of push buttons 60 and 61.

A cold-cathode tube 69 is disposed in a housing 70 provided in a lower front portion of the body 50. The body 50 has a lateral opening 71 opposite the cold-cathode tube 69 in which a transparent plate is fitted. The inner surface of the housing 70 behind the cold-cathode tube 69 is so finished to reflect the light from the cold-cathode tube 69 toward the front.

The light beams from the cold-cathode tube 69 enters the rear end surface 66a of the plate 66 passing through the opening 71. The beams are diffused by the irregular reflective surface 66d of the vertical portion 66b and transmitted from the front end surface 66e. Thus, the LCD is back-lighted. At the same time, the push buttons 60 and 61 are illuminated by the cold-cathode tube 69 through the light introducing plate 68.

Since the light source is disposed in the body 50 of the car stereo, the thickness of the grille 42 can be further reduced in the present embodiment.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A lighting device for a grille of a car stereo, the grille having a recess, an operation flap pivotally mounted in the recess, an opening for inserting a sound recording medium formed at a position behind the flap and in the recess, a liquid crystal display panel provided in the flap, and a plurality of buttons for operating the car stereo, the lighting device comprising:
   a first light source provided behind the operation flap;
   a first light introducing plate having a rear end and provided in the flap and disposed behind the liquid crystal display panel, the rear end of the first light introducing plate being positioned adjacent the first light source when the flap is closed, whereby the liquid crystal display panel is lighted by light transmitted from the first light source through the light introducing plate; and
   at least one second light introducing plate provided adjacent the first light source and behind the buttons so as to light the buttons.

2. A lighting device according to claim 1, wherein the first light introducing plate includes a horizontal portion and a vertical portion, a rear end surface of the horizontal portion is disposed adjacent the first light source, and the vertical portion is disposed adjacent the liquid crystal display panel.

3. A lighting device according to claim 1, wherein the grille is detachably mounted on a body of the car stereo.

4. A lighting device according to claim 1, wherein the first light source is a cold-cathode tube.

5. A lighting device according to claim 1, wherein the operation flap is detachably mounted on a holder pivotally mounted on a body of the car stereo.

6. A lighting device according to claim 2, wherein the vertical portion of the first light introducing plate has light diffusing means.

7. A lighting device according to claim 2, wherein a width of the rear end surface of the horizontal portion of the first light introducing plate is smaller than a width of a front end surface of the vertical portion, and a height of the rear end surface is smaller than a height of the front end surface.

8. A car stereo system, comprising:
   a grille having a recess with an opening defined therein for inserting a sound recording medium;
   an operation flap pivotally mounted in the recess of said grill, the opening for the sound recording medium being formed at a position behind said operation flap, said flap including a liquid crystal display panel and a plurality of buttons for operating the car stereo system;
   a first light source mounted with said grille and positioned behind the said operation flap;
   a first light introducing plate mounted with said operation flap and having a rear end alignably positioned so as to be adjacent the light source behind the liquid crystal display panel when said operation flap is closed, whereby the liquid crystal display panel is lighted by light transmitted from said first light source through said light introducing plate, and the opening is lighted by said first light source; and
   at least one second light introducing plate provided adjacent said first light source and behind the plurality of buttons so as to light the buttons.

9. A car stereo system according to claim 8, wherein said first light introducing plate includes a horizontal portion and a vertical portion, a rear end surface of the horizontal portion is disposed adjacent said first light source, and the vertical portion is disposed adjacent the liquid crystal display panel.

10. A car stereo system according to claim 8, wherein said grille is detachably mounted on a body of the car stereo.

* * * * *